(12) United States Patent
Franca-Neto et al.

(10) Patent No.: US 7,519,344 B2
(45) Date of Patent: Apr. 14, 2009

(54) BANDPASS AMPLIFIER, METHOD, AND SYSTEM

(75) Inventors: Luiz M. Franca-Neto, Portland, OR (US); Stephen S. Pawlowski, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 996 days.

(21) Appl. No.: 10/813,992

(22) Filed: Mar. 31, 2004

(65) Prior Publication Data

US 2005/0218974 A1    Oct. 6, 2005

(51) Int. Cl.
*H04B 1/06* (2006.01)

(52) U.S. Cl. .................. 455/266; 455/131; 455/323; 455/339; 455/341

(58) Field of Classification Search ............... 455/266
See application file for complete search history.

(56) References Cited

U.S. PATENT DOCUMENTS

| | | | | |
|---|---|---|---|---|
| 3,727,147 | A * | 4/1973 | DeWitt ................... | 330/84 |
| 3,972,020 | A * | 7/1976 | Carroll et al. ............ | 367/45 |
| 6,029,052 | A * | 2/2000 | Isberg et al. ............. | 455/131 |
| 2003/0206063 | A1* | 11/2003 | Fanous et al. ........... | 330/254 |

* cited by examiner

*Primary Examiner*—Yuwen Pan
*Assistant Examiner*—Ajibola Akinyemi
(74) *Attorney, Agent, or Firm*—Dana B. Lemoine; Lemoine Patent Services, PLLC

(57) ABSTRACT

An amplifier has a band pass response. The band pass response may be set by setting corner frequencies of low pass filters.

10 Claims, 8 Drawing Sheets

BANDPASS AMPLIFIER, METHOD, AND SYSTEM

FIELD

The present invention relates generally to amplifier circuits, and more specifically to band pass amplifier circuits.

BACKGROUND

Electrical signals commonly occupy a particular portion of the frequency spectrum. The portion of the frequency spectrum occupied is often described as a "frequency band" or as the "bandwidth" of the signal. Amplifiers may be used to amplify signals in a particular frequency band. These amplifiers may be referred to as "band pass amplifiers."

DESCRIPTION OF EMBODIMENTS

Figure 1:
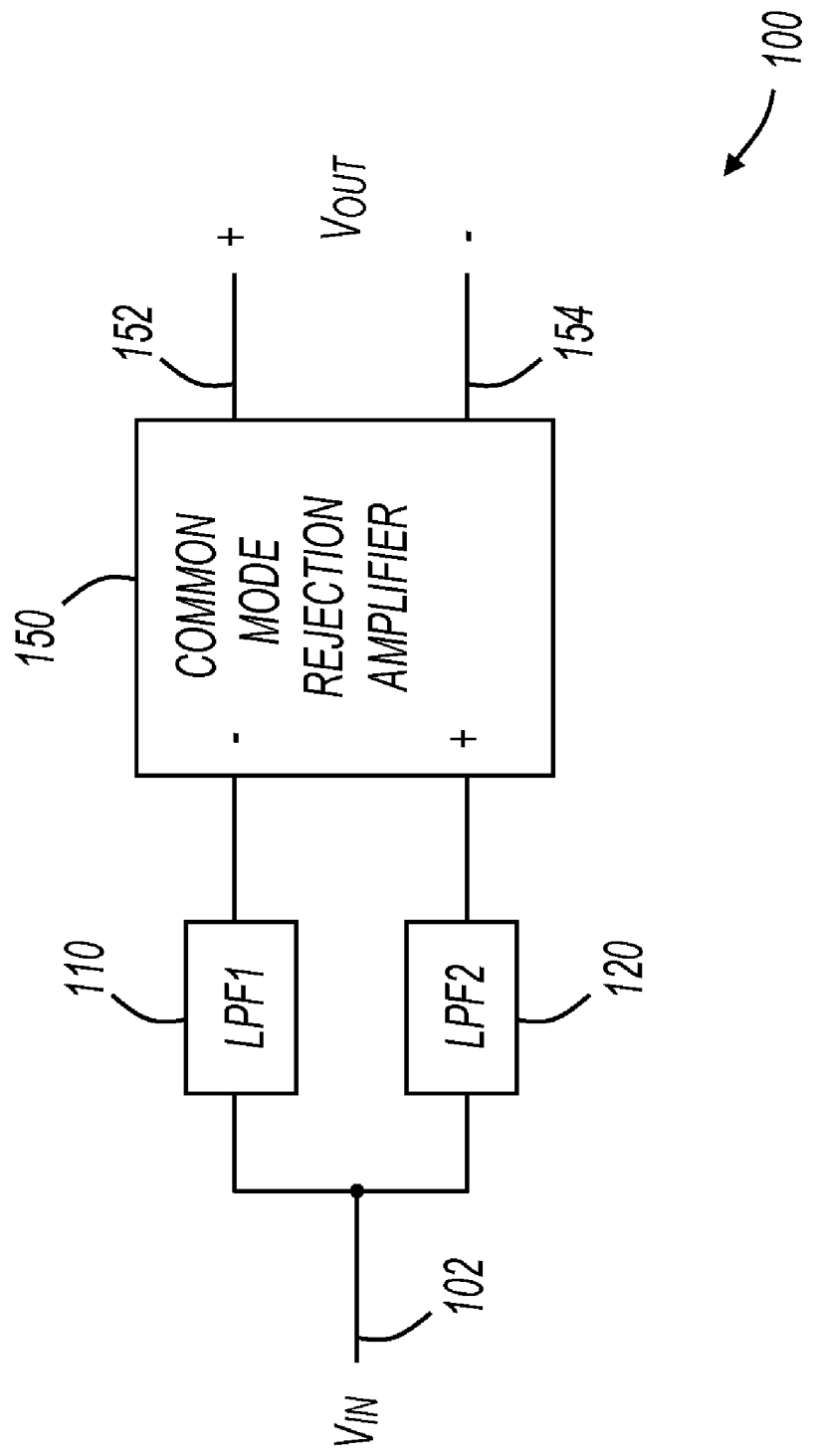
FIG. 1 shows a diagram of a band pass amplifier.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram of a band pass amplifier. Band pass amplifier 100 includes low pass filters 110 (LPF1) and 120 (LPF2), and common mode rejection amplifier 150. Low pass filters labeled LPF1 have a lower corner frequency than low pass filters labeled LPF2. Common mode rejection amplifier 150 may include any type of amplifier that amplifies a difference between two signals presented on its input nodes. For example, common mode rejection amplifier 150 may include a differential pair of transistors that reject common mode signals and amplify differential signals. Various embodiments of common mode rejection amplifiers are described more fully below with reference to the remaining figures.

In operation, band pass amplifier 100 receives an input signal on node 102, and produces a differential output signal on nodes 152 and 154. Band pass amplifier 100 produces a band pass response by filtering the input signal to present desired frequency components to amplifier 150 in differential mode, and to either suppress unwanted frequency components, or to present unwanted frequency components to amplifier 150 in common mode. The desired frequency components are then amplified by amplifier 150, and the others are not.

For example, the input signal on node 102 may be considered to have three frequency components: components that lie below the corner frequency of LPF1 ("low frequency components"), components that lie between the corner frequencies of LPF1 and LPF2 ("desired frequency components"), and components that lie above the corner frequency of LPF2 ("high frequency components"). The low frequency components of the input signal on node 102 pass through low pass filters 110 (LPF1) and 120 (LPF2) and reach a pair of differential inputs of common mode rejection amplifier 150. These low frequency components are presented to amplifier 150 as common mode signals and are not amplified. The desired frequency components of the input signal on node 102 pass through low pass filter 120 (LPF2), but are rejected by low pass filter 110 (LPF1), and reach a pair of differential inputs of common mode rejection amplifier in differential mode where they are amplified. The high frequency components of the input signal on node 102 are blocked by both low pass filters 110 and 120, and are not presented to amplifier 150 to be amplified. The differential output signal on nodes 152 and 154 includes the desired frequency components, but not the low and high frequency components.

The band pass response of band pass amplifier 100 is set by the corner frequencies of low pass filters 110 and 120. For example, the low end of the band pass response corresponds to the corner frequency of low pass filter 110, and the high end of the band pass response corresponds to the corner frequency of low pass filter 120. In some embodiments, low pass filters 110 and 120 have a programmable response to provide a programmable band pass response for band pass amplifier 100. For example, low pass filter 110 may be programmable to set the low end of the band pass response, and low pass filter 120 may be programmable to set the high end of the band pass response. Various embodiments of programmable filters are described with reference to figures that follow.

Figure 2:
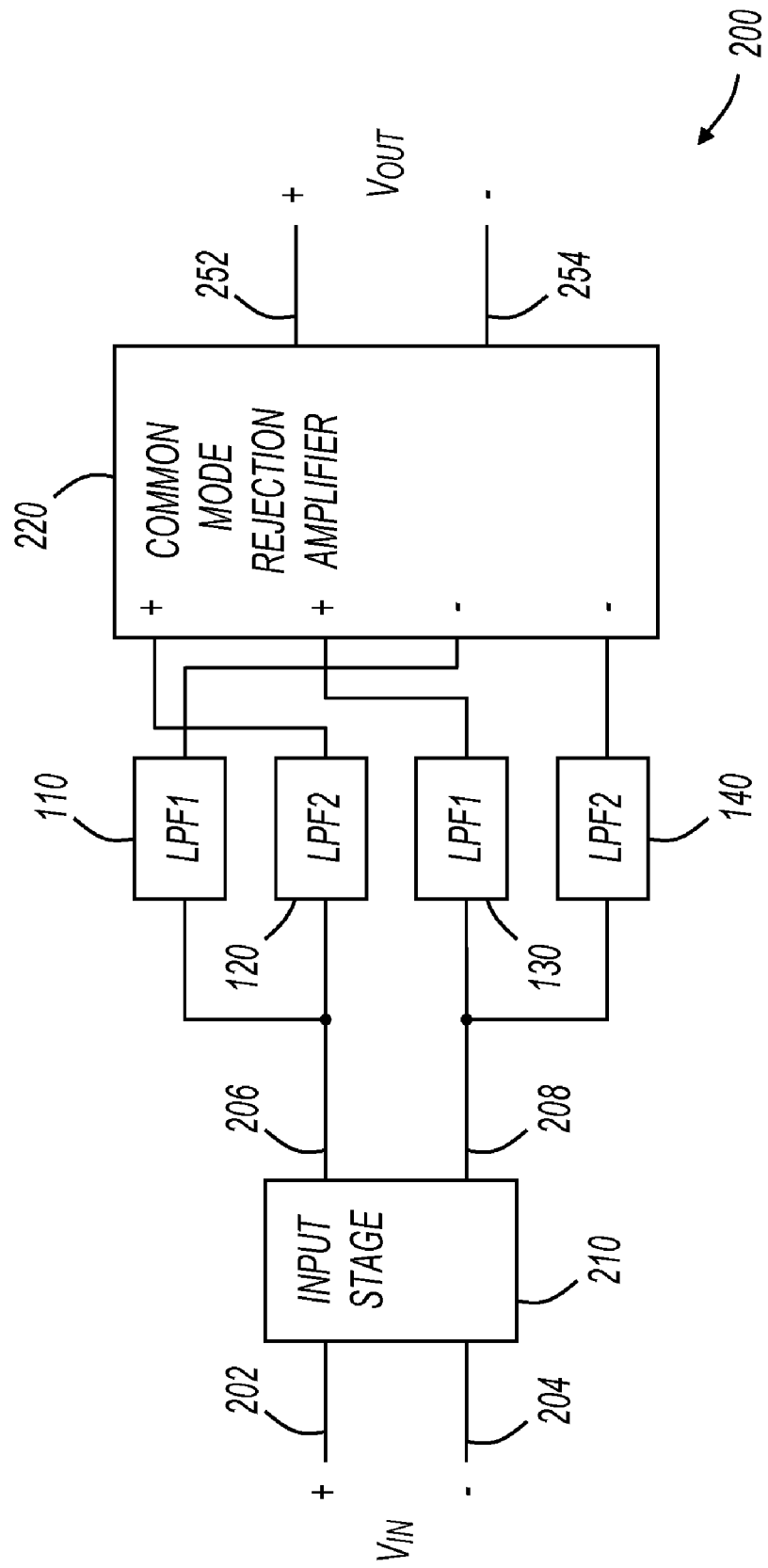
FIGS. 2 and 3 show diagrams of band pass amplifiers with differential input stages.

FIG. 2 shows a diagram of a band pass amplifier with a differential input stage. Band pass filter 200 includes input stage 210, common mode rejection amplifier 220, and low pass filters 110, 120, 130, and 140. Low pass filters having the same designation (e.g., LPF1 or LPF2) are meant to have substantially the same corner frequency. For example, low pass filters 110 and 130 are labeled LPF1 and have similar corner frequencies, and low pass filters 120 and 140 are labeled LPF2 and have similar corner frequencies.

Input stage 210 receives a differential input signal on nodes 202 and 204, and produces a differential output signal on nodes 206 and 208. In some embodiments, input stage 210 is a wideband amplifier that amplifies signals in a broad frequency spectrum. For example, in some embodiments, input stage 210 may amplify all three frequency components described above with reference to FIG. 1. Low pass filters 110 and 120 receive signals on node 206, and low pass filters 130 and 140 receive signals on node 208. Low pass filters 110, 120, 130, and 140 drive input nodes of common mode rejection amplifier 220.

Figure 3:
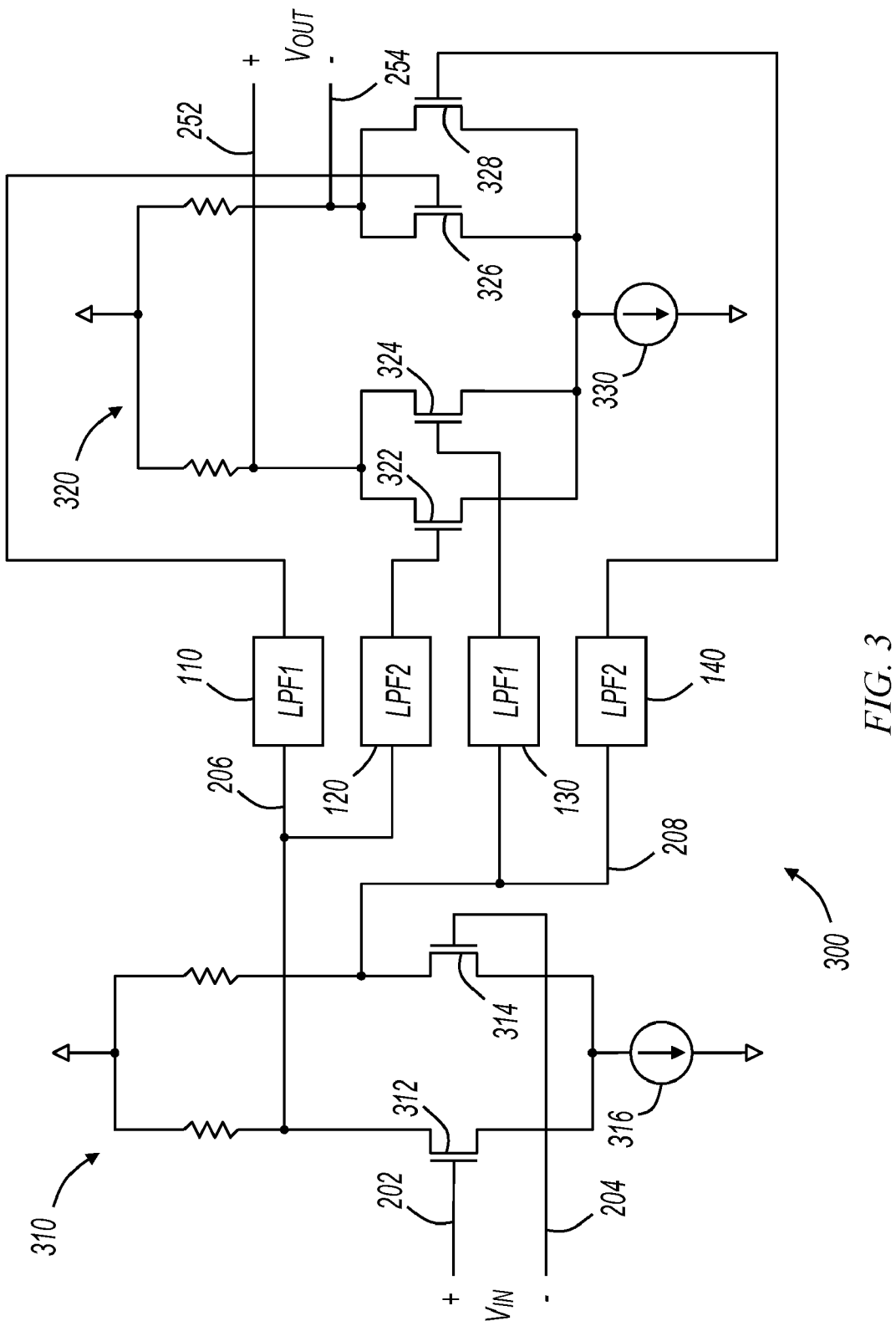

Common mode rejection amplifier 220 includes two positive inputs and two negative inputs. For example, low pass filters 120 and 130 drive positive inputs and low pass filters 110 and 140 drive negative inputs. In some embodiments, common mode rejection amplifier 220 includes parallel differential stages that receive signals from low pass filters 110, 120, 130, and 140. FIG. 3, discussed below, shows an embodiment that includes parallel differential stages within a common mode rejection amplifier.

Common mode rejection amplifier 220 operates to amplify frequency components that lie between the corner frequencies of the low pass filters. For example, low frequency components (below the corner of LPF1) present on nodes 206 and 208 are passed in common mode to amplifier 220 where they are rejected; desired frequency components (between the corners of LPF1 and LPF2) are passed differentially to amplifier 220 where they are amplified; and high frequency components (above the corner of LPF2) are blocked by low pass filters 110, 120, 130, and 140 and are not passed to common mode rejection amplifier 220.

The corner frequencies of LPF1 and LPF2 set a band pass response of amplifier 200, where the lower band pass corner frequency is set by the corner frequency of LPF1 and the higher band pass corner frequency is set by the corner frequency of LPF2. In some embodiments, the corner frequencies of LPF1 and LPF2 are programmable to allow the pass band to be variable. In these embodiments, the pass band may be "slid" up or down in frequency, and band pass amplifier 200 may be referred to as a "sliding band pass amplifier."

FIG. 3 shows a diagram of a band pass amplifier with a differential input stage. Band pass filter 300 includes input stage 310, common mode rejection amplifier 320, and low pass filters 110, 120, 130, and 140. Input stage 310 includes a differential pair of input transistors 312 and 314, current source 316, and load devices shown as resistors. The differential pair of input transistors receive a differential input signal on nodes 202 and 204, and produce a differential output signal on nodes 206 and 208. In some embodiments, input stage 310 is a wideband amplifier that amplifies signals in a broad frequency spectrum. For example, in some embodiments, input stage 310 may amplify all three frequency components described above with reference to FIG. 1. Input stage 310 is shown in FIG. 3 with resistive load devices, but this is not a limitation of the present invention. For example, in some embodiments, active load devices are utilized.

The transistors shown in FIG. 3 are shown as isolated gate transistors, and specifically as metal oxide semiconductor field effect transistors (MOSFETs). For example, transistors 312 and 314 are shown as N-type MOSFETs. Other types of switching or amplifying elements may be utilized for the various transistors of band pass amplifier 300 without departing from the scope of the present invention. For example, the transistors of amplifier 310 may be P-type MOSFETs, junction field effect transistors (JFETs), bipolar junction transistors (BJTs), or any device capable of performing as described herein.

Common mode rejection amplifier 320 includes transistors 322, 324, 326, and 328, current source 330, and load devices shown as resistors. Transistors 322 and 326 form a first differential input stage of common mode amplifier 320, and transistors 324 and 328 form a second differential input stage of common mode rejection amplifier 320. The two differential input stages are coupled in parallel, and output nodes are formed at nodes 252 and 254.

Low pass filters 110 and 120 receive signals on node 206, and low pass filters 130 and 140 receive signals on node 208. Low pass filters 110 and 120 drive transistors 326 and 322, which form a first differential input pair of transistors in common mode rejection amplifier 320. Low pass filters 130 and 140 drive transistors 324 and 328, form a second differential input pair of transistors in common mode rejection amplifier 320. The two differential input pairs are coupled in parallel. In addition, transistors 322 and 328 can be viewed as a differential input pair and transistors 324 and 326 can be viewed as a differential input pair where the two differential input pairs are coupled in parallel.

The parallel differential input stages in common mode rejection amplifier 320 operate to amplify frequency components that lie between the corner frequencies of the low pass filters. For example, low frequency components (below the corner of LPF1) present on nodes 206 and 208 are passed in common mode to transistors 322, 324, 326, and 328 where they are rejected; desired frequency components (between the corners of LPF1 and LPF2) are passed differentially to transistors 322 and 328 where they are amplified; and high frequency components (above the corner of LPF2) are blocked by low pass filters 110, 120, 130, and 140 and are not passed to common mode rejection amplifier 320.

The corner frequencies of LPF1 and LPF2 set a band pass response of amplifier 300, where the lower band pass corner frequency is set by the corner frequency of LPF1 and the higher band pass corner frequency is set by the corner frequency of LPF2. In some embodiments, the corner frequencies of LPF1 and LPF2 are programmable to allow the pass band to be variable. In these embodiments, the pass band may be "slid" up or down in frequency, and band pass amplifier 300 may be referred to as a "sliding band pass amplifier."

In some embodiments, the various band pass amplifiers may be implemented using a complementary metal oxide semiconductor (CMOS) process. As described further below, low pass filters and programmable low pass filters may be implemented fairly efficiently in CMOS. By constructing a band pass amplifier using low pass filters in a CMOS process, the various embodiments of the present invention may provide efficient implementations in terms of area, power consumption, and frequency response.

Figure 4:
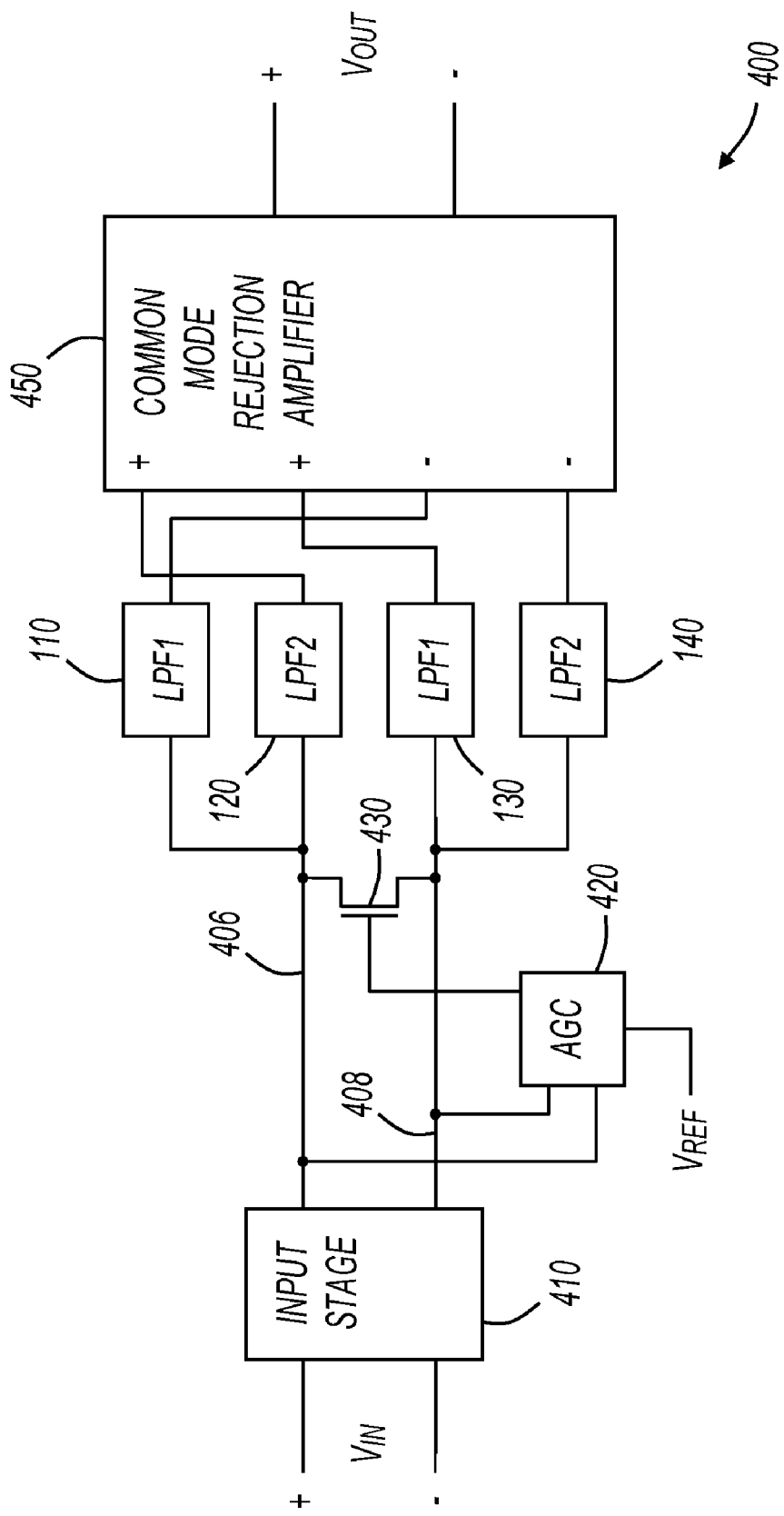
FIGS. 4 and 5 show diagrams of band pass amplifiers with automatic gain control.
Figure 5:
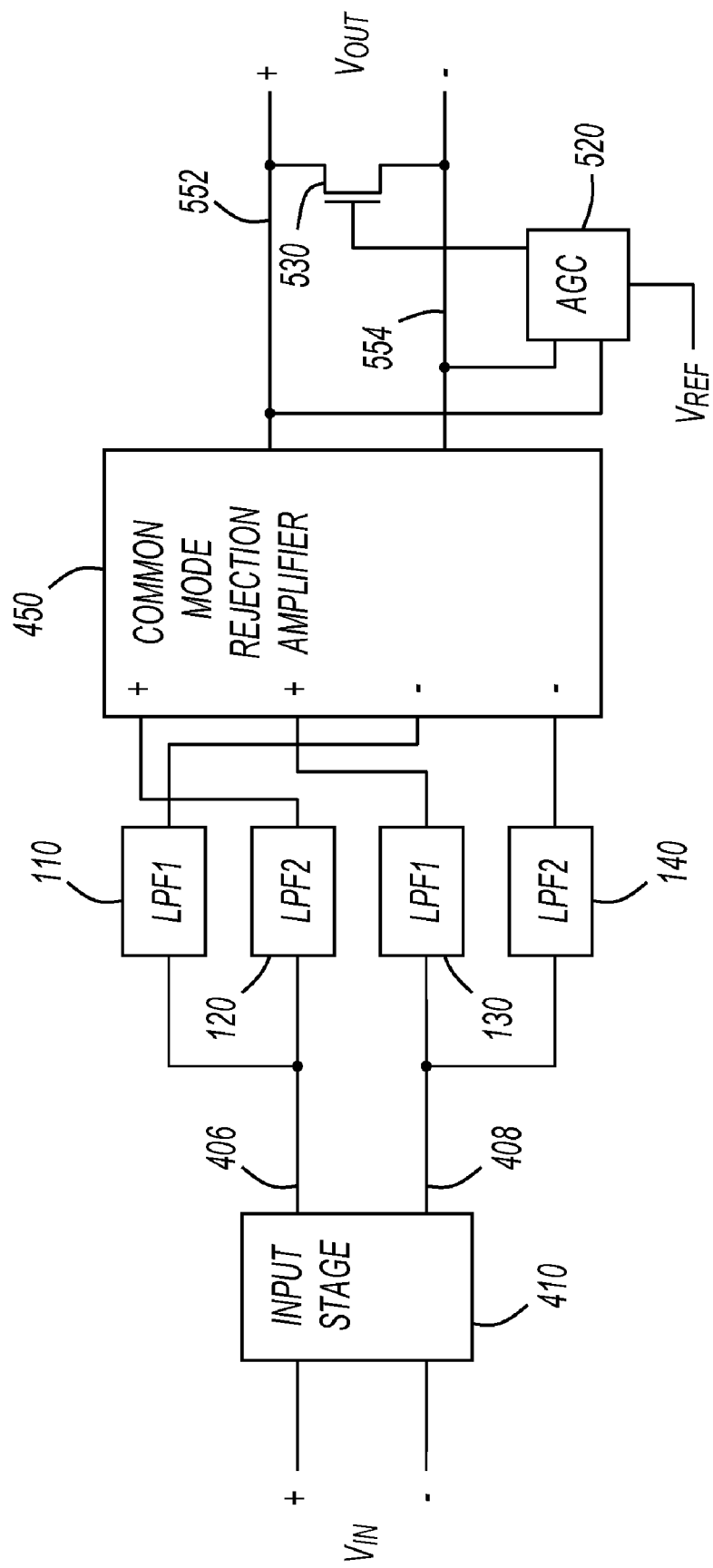

FIGS. 4 and 5 show diagrams of band pass amplifiers with automatic gain control. Band pass amplifier 400 (FIG. 4) includes input stage 410, low pass filters 110, 120, 130, and 140, and common mode rejection amplifier 450. Input stage 410 may be any suitable input stage, including input stage 210 (FIG. 2) or input stage 310 (FIG. 3). Further, common mode rejection amplifier 450 may be any suitable amplifier, including common mode rejection amplifier 220 (FIG. 2) or common mode rejection amplifier 320 (FIG. 3).

Band pass amplifier 400 also includes automatic gain control (AGC) circuit 420 and shunt transistor 430. In operation, AGC circuit 420 compares a differential voltage on nodes 406 and 408 with a reference voltage VREF, and conditionally turns on shunt transistor 430 to reduce the differential voltage on nodes 406 and 408. AGC circuit 420 may be any suitable circuit capable of sensing the differential voltage on nodes 406 and 408, and operating shunt transistor 430. The present invention is not limited by the type or amount of circuitry included in AGC 420.

Band pass amplifier 500 (FIG. 5) includes input stage 410, low pass filters 110, 120, 130, and 140, and common mode rejection amplifier 450. Band pass amplifier 500 also includes automatic gain control (AGC) circuit 520 and shunt transistor 530. In operation, AGC circuit 520 compares a differential voltage on nodes 552 and 554 with a reference voltage VREF, and conditionally turns on shunt transistor 530 to reduce the differential voltage on nodes 552 and 554. AGC circuit 520 may be any suitable circuit capable of sensing the differential voltage on nodes 552 and 554, and operating shunt transistor

530. The present invention is not limited by the type or amount of circuitry included in AGC 520.

In some embodiments, an AGC circuit senses a differential voltage on nodes 406 and 408 (as shown in FIG. 4), and operates a shunt transistor coupled between nodes 552 and 554 (as shown in FIG. 5). In other embodiments, an AGC circuit senses a differential voltage on nodes 552 and 554 (as shown in FIG. 5), and operates a shunt transistor coupled between nodes 406 and 408 (as shown in FIG. 4). Many different embodiments exist with various AGC configurations and shunt transistor configurations.

Figure 6:
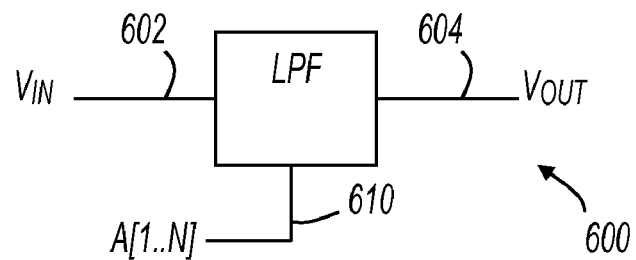
FIGS. 6 and 7 show diagrams of programmable low pass filters.
Figure 7:
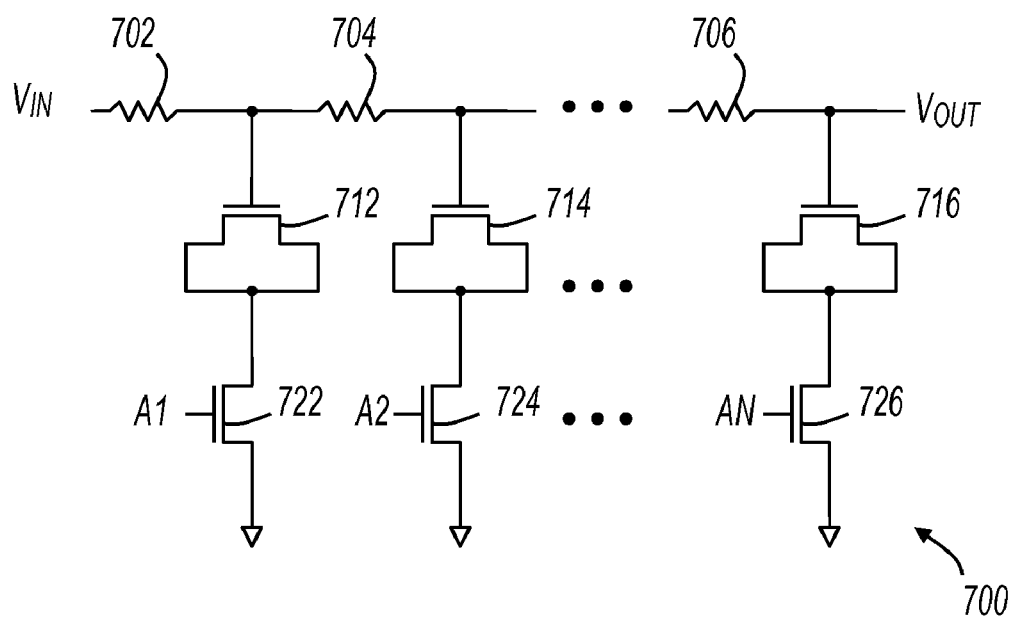

FIGS. 6 and 7 show diagrams of programmable low pass filters. Programmable low pass filter 600 (FIG. 6) receives an input signal on node 602 and produces an output signal on node 604. Programmable low pass filter 600 also receives a digital control word A[1 ... N] at 610. In some embodiments, the digital control word may be manipulated to control the corner frequency of programmable low pass filter 600. When programmable low pass filter 600 is utilized for one or more of low pass filters 110, 120, 130, and 140, a sliding band pass amplifier may be produced with band pass corner frequencies settable by changing the corner frequencies of one or more programmable low pass filters.

Programmable low pass filter 700 (FIG. 7) includes multiple resistor capacitor (RC) stages that are individually selectable. For example, resistor 702 and capacitor 712 are selectable by turning on transistor 722, resistor 704 and capacitor 714 are selectable by turning on transistor 724, and resistor 706 and capacitor 716 are selectable by turning on transistor 726. Capacitors 712, 714, and 716 are formed from MOS transistors, although this is not a limitation of the present invention. Resistors 702, 704, and 706 may be any suitable resistive element, including, but not limited to, polysilicon resistors manufactured in a complementary metal oxide semiconductor (CMOS) process, or MOS transistors operating in the linear region.

As RC stages are selected, they are added to low pass filter 700, effectively lowering the corner frequency. As RC stages are de-selected, they are electrically removed from low pass filter 700, effectively increasing the corner frequency. When programmable filter 700 is used for one or more of low pass filters 110, 120, 130, and 140 in the band pass amplifier embodiments of the present invention, the band pass response of the amplifier may be changed by changing the digital control word that controls the corner frequency of the programmable low pass filter.

Figure 8:
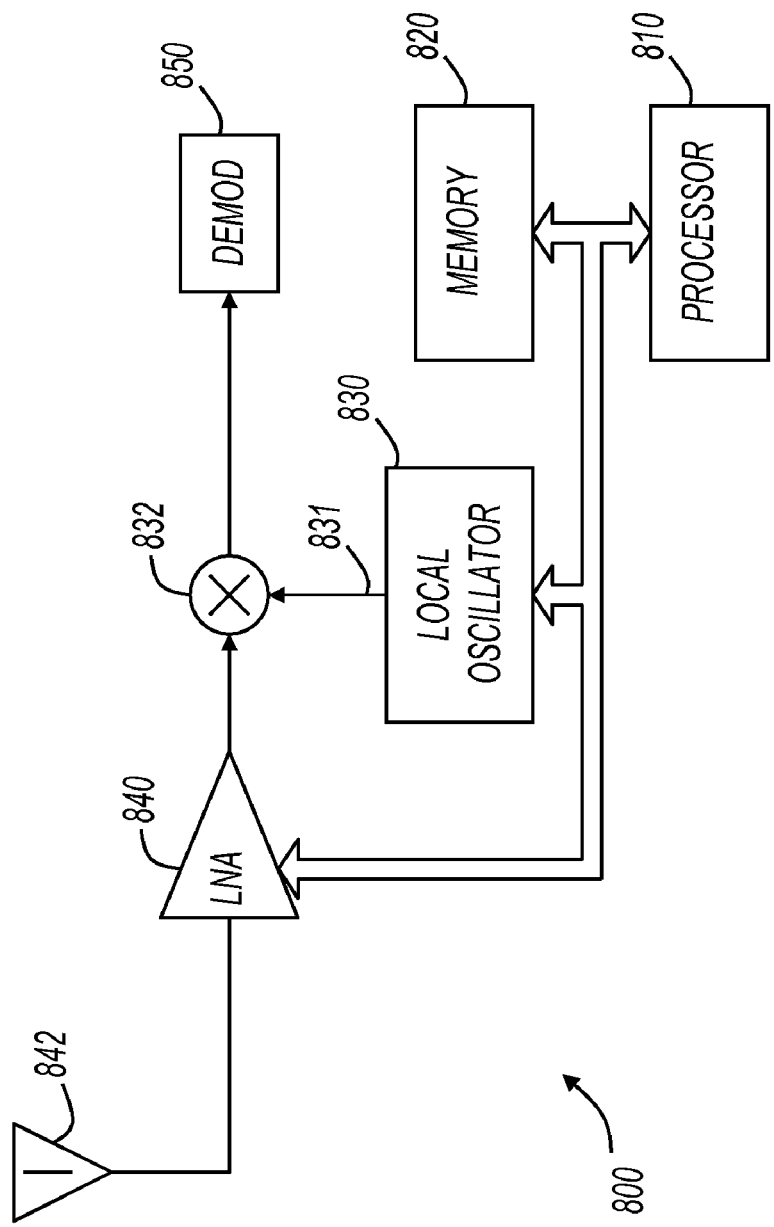
FIG. 8 shows a diagram of an electronic system in accordance with various embodiments of the present invention.

FIG. 8 shows a diagram of an electronic system in accordance with various embodiments of the present invention. Electronic system 800 includes processor 810, memory 820, local oscillator 830, mixer 832, low noise amplifier (LNA) 840, antenna 842, and demodulator (DEMOD) 850.

Low noise amplifier 840 may include a sliding band pass amplifier such as one or more of amplifiers 100, 200, 300, 400, or 500 (FIGS. 1-5). Further, LNA 840 may include a sliding band pass amplifier such one of the aforementioned band pass amplifiers that utilizes one or more programmable low pass filters, such as programmable low pass filter 600 (FIG. 6) or 700 (FIG. 7). In embodiments that include a sliding band pass amplifier, LNA 840 may be an amplifier with a wideband front end and a sliding narrow band output. For example, LNA 840 may accept signals between substantially 1 Gigahertz (GHz) and 6 GHz, and the output bandwidth may be selectable in 100 Megahertz (MHz) increments. In these embodiments, a single LNA may be able to receive a wide variety of communications signals in different sub-bands.

Antenna 842 may be either a directional antenna or an omni-directional antenna. As used herein, the term "omni-directional" refers to a substantially circular antenna pattern in at least one plane. For example, in some embodiments, antenna 842 may be an omni-directional antenna such as a dipole antenna, or a quarter-wave antenna. Also for example, in some embodiments, antenna 842 may be a directional antenna such as a parabolic dish antenna or a Yagi antenna. In some embodiments, antenna 842 is omitted, and in other embodiments, antenna 842 includes multiple antennas or multiple antenna elements.

Local oscillator 830 may include a frequency synthesizer to provide a local oscillator signal to mixer 832 on node 831. Mixer 832 also may receive a signal from LNA 840. In some embodiments, mixer 832 may utilize the local oscillator signal to "down-convert" the signal received from LNA 840 directly to baseband. In these embodiments, electronic system 800 may be referred to as a "zero-IF" receiver, in part because it does not utilize an intermediate frequency (IF). In other embodiments, mixer 832 may utilize the local oscillator signal to down-convert the signal received from LNA 840 to an intermediate frequency. In these embodiments, electronic system 800 may be referred to as a heterodyne receiver or a superheterodyne receiver.

In some embodiments, processor 810 may be a processor that can perform methods described below with reference to FIG. 9. For example, processor 810 may perform methods that set a pass band of a sliding band pass amplifier. Processor 810 represents any type of processor, including but not limited to, a microprocessor, a microcontroller, a digital signal processor, a personal computer, a workstation, or the like.

Memory 820 represents an article that includes a machine readable medium. For example, memory 820 represents any one or more of the following: a hard disk, a floppy disk, random access memory (RAM), dynamic random access memory (DRAM), static random access memory (SRAM), read only memory (ROM), flash memory, CDROM, or any other type of article that includes a medium readable by a machine such as processor 810. In some embodiments, memory 820 can store instructions for performing the execution of the various method embodiments of the present invention.

In operation of some embodiments, processor 810 reads instructions and data from memory 820 and performs actions in response thereto. For example, various method embodiments of the present invention may be performed by processor 810 while reading instructions from memory 820.

In some embodiments, system 800 may be a communications system, and processor 810 may be a computing device that performs various tasks within the communications system. For example, system 800 may be a system that provides wireless networking capabilities to a computer. In these embodiments, processor 810 may implement all or a portion of a device driver, or may implement all or part of a media access control (MAC) layer within a communications protocol. In some embodiments, system 800 includes a transceiver that both transmits and receives signals at antenna 842. For example, system 800 may be a cell phone with a transmitter and a receiver. Also for example, system 800 may be a wireless local area network interface that includes both a transmitter and a receiver.

In operation, processor 810 may tune system 800 to a particular sub-band by commanding local oscillator 830 to tune to a particular frequency, and commanding LNA 840 to slide the pass band to a particular frequency band. By coordinating the operation of LNA 840 and local oscillator 830, any frequency band of interest may be down-converted to the appropriate frequency for demodulation by demod 850. In some embodiments, demod 850 accepts signals at a particular intermediate frequency (IF), and in other embodiments, demod 850 accepts signals at baseband.

A sliding band pass amplifier may be used in systems other than systems represented by FIG. 8. For example, a sliding band pass amplifier may be used to amplify signals other than signals received from an antenna. Examples include, but are not limited to, receiving signals from electrical conductors, and receiving signals in optical systems. Many other system-level uses exist for sliding band pass amplifiers.

Band pass amplifiers, sliding band pass amplifiers, programmable low pass filters, receivers, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of band pass amplifier 300 (FIG. 3) may be represented as polygons assigned to layers of an integrated circuit.

Figure 9:
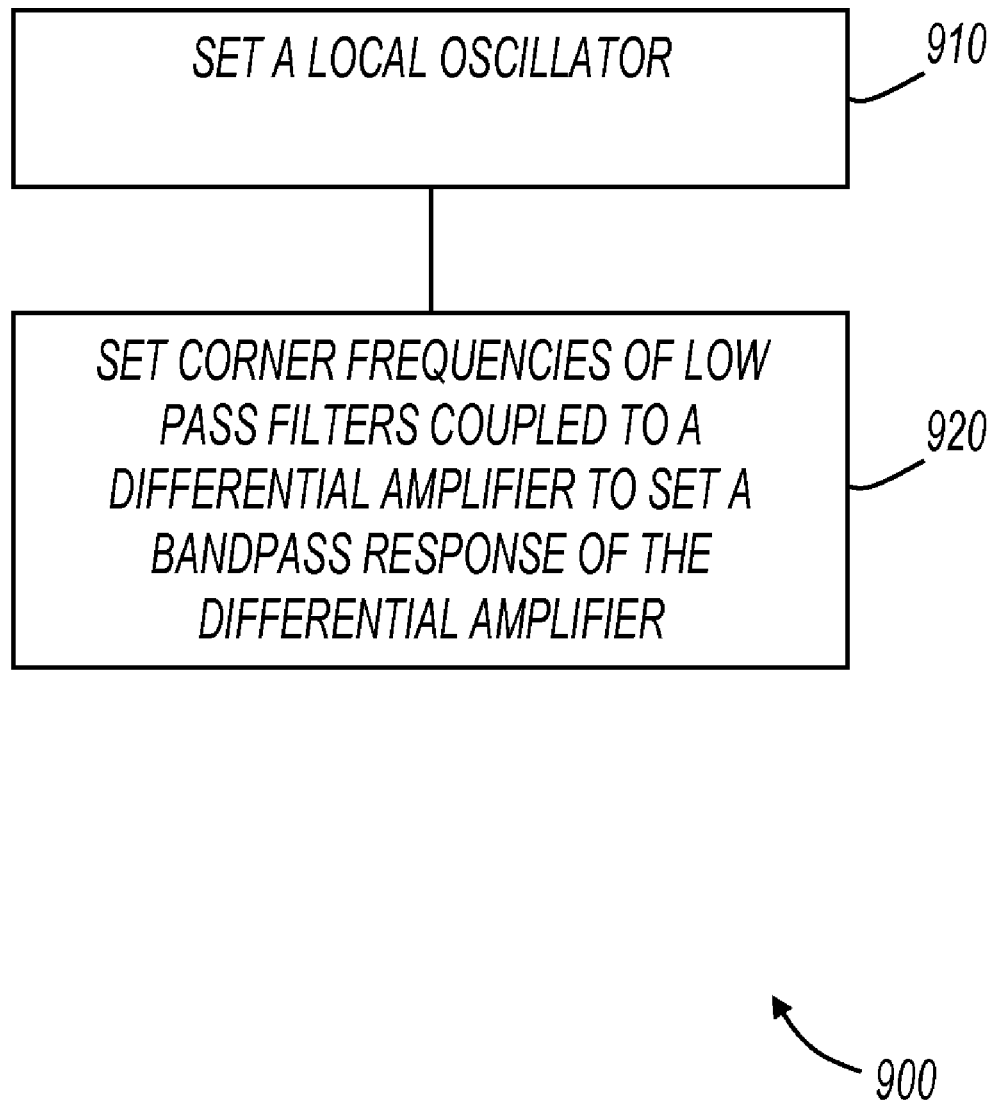
FIG. 9 shows a flowchart in accordance with various embodiments of the present invention.

FIG. 9 shows a flowchart in accordance with various embodiments of the present invention. In some embodiments, method 900, or portions thereof, is performed by a processor, embodiments of which are shown in previous figures. In other embodiments, method 900 is performed by a receiver, an integrated circuit, or an electronic system. Method 900 is not limited by the particular type of apparatus performing the method. The various actions in method 900 may be performed in the order presented, or may be performed in a different order. Further, in some embodiments, some actions listed in FIG. 9 are omitted from method 900.

Method 900 is shown beginning with block 910 in which a local oscillator is set to produce a local oscillator signal. The local oscillator may include a frequency synthesizer, and the action of setting the local oscillator may include writing a digital word to a register that controls the frequency output of the local oscillator. In some embodiments, a processor such as processor 810 (FIG. 8) may set a local oscillator such as local oscillator 830 in an electronic system.

At 920, a corner frequency of at least one programmable low pass filter is set. The programmable low pass filter may be a filter coupled to a differential amplifier, and the operation of setting a corner frequency of the low pass filter may set a band pass response of the differential amplifier. For example, referring now back to FIG. 2, if low pass filters 110 and 130 are programmable low pass filters, setting their corner frequencies also sets the lower corner frequency of the band pass response of band pass amplifier 200. Also for example, setting a corner frequency of low pass filters 120 and 140 also sets the upper corner frequency of the band pass response of band pass amplifier 200.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
a common mode rejection amplifier including first and second input transistors to form a first differential input stage, and third and fourth input transistors to form a second differential input stage, the first and second differential input stages coupled in parallel;
a plurality of low pass filters coupled to the common mode rejection amplifier to produce a band pass amplifier response; and
an input amplifier having first and second differential outputs;
wherein the plurality of low pass filters comprises first and second low pass filters coupled to receive signals from the first differential output of the input amplifier, and third and fourth low pass filters coupled to receive signals from the second differential output of the input amplifier, and wherein the first and third low pass filters are coupled to provide signals to the first and second input transistors, respectively, of the first differential input stage, and the second and fourth low pass filters are coupled to provide signals to the third and fourth input transistors, respectively, of the second differential input stage.

2. The apparatus of claim 1 wherein at least one of the plurality of low pass filters comprises a programmable low pass filter.

3. The apparatus of claim 1 wherein:
the first and third low pass filters have substantially the same corner frequency; and
the second and fourth low pass filters have substantially the same corner frequency.

4. An apparatus comprising:
first and second differential input nodes;
first and second low pass filters coupled to receive a first signal from the first differential input node;
third and fourth low pass filters coupled to receive a second signal from the second differential input node; and
a differential amplifier including first and second input transistors to form a first differential input stage, and third and fourth input transistors to form a second differential input stage, the first and second differential input stages coupled in parallel, wherein the first and third low pass filters are coupled to provide signals to the first and second input transistors, respectively, of the first differential input stage, and the second and fourth low pass filters are coupled to provide signals to the third and fourth input transistors, respectively, of the second differential input stage.

5. The apparatus of claim 4 wherein at least one of the first, second, third, and fourth low pass filters has a programmable response.

6. The apparatus of claim 4 further comprising an automatic gain control circuit having a transistor to shunt a pair of differential output nodes from the differential amplifier.

7. The apparatus of claim 6 wherein the automatic gain control is coupled to sense a voltage on the first and second differential input nodes.

8. The apparatus of claim 6 wherein the automatic gain control is coupled to sense a voltage on the differential output nodes of the differential amplifier.

9. The apparatus of claim 4 further comprising an input amplifier coupled to receive an input signal and to drive the first and second differential input nodes.

10. The apparatus of claim 9 wherein the first and third low pass filters exhibit a corner frequency corresponding to a first corner frequency of a band pass response, and the second and fourth low pass filters exhibit a corner frequency corresponding to a second corner frequency of the band pass response.

* * * * *